(12) United States Patent
Choi et al.

(10) Patent No.: US 11,923,195 B2
(45) Date of Patent: *Mar. 5, 2024

(54) SINGLE CRYSTAL SEMICONDUCTOR STRUCTURE AND METHOD OF MANUFACTURING THE SAME

(71) Applicants: SAMSUNG ELECTRONICS CO., LTD., Suwon-si (KR); iBeam Materials, Inc., Santa Fe, NM (US)

(72) Inventors: Junhee Choi, Seongnam-si (KR); Vladmir Matias, Santa Fe, NM (US); Joohun Han, Hwaseong-si (KR)

(73) Assignees: SAMSUNG ELECTRONICS CO., LTD., Suwon-si (KR); iBeam Materials, Inc., Santa Fe, NM (US)

( * ) Notice: Subject to any disclaimer, the term of this patent is extended or adjusted under 35 U.S.C. 154(b) by 292 days.

This patent is subject to a terminal disclaimer.

(21) Appl. No.: 17/352,851

(22) Filed: Jun. 21, 2021

(65) Prior Publication Data

US 2022/0285151 A1     Sep. 8, 2022

Related U.S. Application Data

(60) Provisional application No. 63/157,981, filed on Mar. 8, 2021.

(30) Foreign Application Priority Data

Mar. 31, 2021   (KR) .......................... 10-2021-0042231

(51) Int. Cl.
*H01L 21/02* (2006.01)

(52) U.S. Cl.
CPC .. *H01L 21/02502* (2013.01); *H01L 21/02488* (2013.01); *H01L 21/02491* (2013.01); *H01L 21/02496* (2013.01); *H01L 21/02505* (2013.01); *H01L 21/02513* (2013.01); *H01L 21/02516* (2013.01); *H01L 21/02598* (2013.01); *H01L 21/02192* (2013.01); *H01L 21/02266* (2013.01); *H01L 21/02422* (2013.01); *H01L 21/02425* (2013.01); *H01L 21/02458* (2013.01);

(Continued)

(58) Field of Classification Search
None
See application file for complete search history.

(56) References Cited

U.S. PATENT DOCUMENTS

| 8,956,952 B2 | 2/2015 | Machuca et al. |
| 10,546,976 B2 | 1/2020 | Matias et al. |

(Continued)

FOREIGN PATENT DOCUMENTS

JP     2005-001961 A     1/2005

*Primary Examiner* — Alexander G Ghyka
(74) *Attorney, Agent, or Firm* — Sughrue Mion, PLLC

(57) ABSTRACT

A single crystal semiconductor includes a strain compensation layer; an amorphous substrate disposed on the strain compensation layer; a lattice matching layer disposed on the amorphous substrate and including two or more single crystal layers; and a single crystal semiconductor layer disposed on the lattice matching layer, the lattice matching layer including a direction control film disposed on the amorphous substrate and including a single crystal structure, and a buffer layer including a material different from that of the direction control film, the buffer layer being disposed on the direction control film and including a single crystal structure.

29 Claims, 7 Drawing Sheets

(52) U.S. Cl.
CPC .. *H01L 21/02461* (2013.01); *H01L 21/02463* (2013.01); *H01L 21/0254* (2013.01); *H01L 21/02543* (2013.01); *H01L 21/02546* (2013.01); *H01L 21/02609* (2013.01); *H01L 21/0262* (2013.01); *H01L 21/02631* (2013.01)

(56) References Cited

U.S. PATENT DOCUMENTS 11,508,820 B2 * 11/2022 Choi ................ H01L 21/02428
2001/0001207 A1  5/2001 Shimizu et al.

* cited by examiner

High temperature

High temperature

Room temperature

SINGLE CRYSTAL SEMICONDUCTOR STRUCTURE AND METHOD OF MANUFACTURING THE SAME

CROSS-REFERENCE TO RELATED APPLICATIONS

This application claims priority under 35 U.S.C. § 119 to U.S. Provisional Application No. 63/157,981, filed on Mar. 8, 2021, in the United States Patent and Trademark Office, and to Korean Patent Application No. 10-2021-0042231, filed on Mar. 31, 2021, in the Korean Intellectual Property Office, the disclosures of which are incorporated by reference herein in their entireties.

BACKGROUND

1. Field

The disclosure relates to single crystal semiconductor structures and methods of manufacturing the same.

2. Description of Related Art

A single crystal substrate is used for epitaxy growth of a single crystal Group III-V compound semiconductor layer. For example, a c-plane sapphire substrate or a single crystal silicon substrate having the (111) direction is used for the growth of a single crystal GaN layer. Because the size of single crystal substrates is limited, the size of epitaxially-grown single crystal Group III-V compound semiconductor layers is also limited. In addition, because single crystal substrates are expensive, epitaxy growth processes for forming single crystal Group III-V compound semiconductor layers are costly. Thus, epitaxy growth processes using substrates other than single crystal substrates are researched to reduce the costs of epitaxy growth processes for forming single crystal Group III-V compound semiconductor layers and freely to determine the size of single crystal Group III-V compound semiconductor layers.

SUMMARY

Provided are single crystal semiconductor structures including a single crystal semiconductor layer formed on an amorphous substrate.

Provided are methods of forming a single crystal semiconductor layer on an amorphous substrate.

In addition, provided are single crystal semiconductor structures capable of compensating for a strain due to a difference in a coefficient of thermal expansion between an amorphous substrate and a single crystal semiconductor layer when the single crystal semiconductor layer is formed on the amorphous substrate, and a method of manufacturing the same.

Additional aspects will be set forth in part in the description which follows and, in part, will be apparent from the description, or may be learned by practice of embodiments of the disclosure.

In accordance with an aspect of the disclosure, a single crystal semiconductor structure includes a strain compensation layer; an amorphous substrate disposed on the strain compensation layer; a lattice matching layer disposed on the amorphous substrate, the lattice matching layer including two or more single crystal layers; and a single crystal semiconductor layer disposed on the lattice matching layer, wherein the lattice matching layer includes a direction control film disposed on the amorphous substrate, the direction control film including a single crystal structure, and a buffer layer including a material different from a material of the direction control film, the buffer layer being disposed on the direction control film and comprising a single crystal structure, wherein a thickness of the direction control film is equal to or less than 10 times a critical thickness $h_c$, and wherein the critical thickness $h_c$ is determined by a following equation:

$$h_c = \left[\frac{b}{4\pi(1+\mu)\epsilon_0}\right]\left[\ln\left(\frac{h_c}{b}\right)+1\right]$$

(b: Burgers vector, μ: Poisson's ratio, and $\epsilon_0$: a degree of lattice misfit between the direction control film and the single crystal semiconductor layer).

A first difference between a coefficient of thermal expansion of the strain compensation layer and a coefficient of thermal expansion of the single crystal semiconductor layer may be less than a second difference between a coefficient of thermal expansion of the amorphous substrate and the coefficient of thermal expansion of the single crystal semiconductor layer.

The first difference may be equal to or less than 10% of the coefficient of thermal expansion of the single crystal semiconductor layer within a temperature range of about 200° C. to about 1200° C.

The strain compensation layer may include a molybdenum (Mo) alloy.

A lattice structure of the direction control film may match a lattice structure of the buffer layer.

A crystal of the direction control film may be oriented in a (111) direction.

The direction control film may include $CeO_2$ or $Sc_2O_3$.

The buffer layer may include a single layer comprising MgO or AlN.

The buffer layer may include a first buffer layer disposed on the direction control film and a second buffer layer disposed on the first buffer layer, the second buffer layer including a material different from the first buffer layer, the first buffer layer may include $CeO_2$ or $Sc_2O_3$ formed by a deposition process different from a deposition process of the direction control film, and the second buffer layer may include MgO or AlN.

The buffer layer may include a first buffer layer disposed on the direction control film and a second buffer layer disposed on the first buffer layer, the second buffer layer including a material different from the first buffer layer, the first buffer layer may include MgO or AlN, and the second buffer layer may include a same material as a material of the single crystal semiconductor layer.

A crystallinity of the single crystal semiconductor layer may be higher than a crystallinity of the second buffer layer.

The single crystal semiconductor structure may further include a mask pattern disposed between the single crystal semiconductor layer and the lattice matching layer, wherein the mask pattern includes holes exposing the lattice matching layer, and wherein the single crystal semiconductor layer is disposed on the mask pattern and fills the holes.

The single crystal semiconductor structure may further include a heat dispersion layer disposed between the lattice matching layer and the amorphous substrate.

The single crystal semiconductor structure may further include a planarization layer disposed between the heat dispersion layer and the lattice matching layer, wherein a surface roughness of an upper surface of the planarization layer facing the lattice matching layer is less than a surface roughness of a lower surface of the planarization layer facing the heat dispersion layer.

In accordance with an aspect of the disclosure, a method of manufacturing a single crystal semiconductor structure includes providing an amorphous substrate; forming a strain compensation layer on a lower surface of the amorphous substrate; forming a lattice matching layer on the amorphous substrate, the lattice matching layer including two or more single crystal layers; and forming a single crystal semiconductor layer on the lattice matching layer, wherein the lattice matching layer includes a direction control film disposed on the amorphous substrate, the direction control film including a single crystal structure, and a buffer layer comprising a material different from the direction control film, the buffer layer being disposed on the direction control film and including a single crystal structure, wherein a thickness of the direction control film is less than 10 times a critical thickness $h_c$, and wherein the critical thickness $h_c$ is determined by a following equation:

$$h_c = \left[\frac{b}{4\pi(1+\mu)\epsilon_0}\right]\left[\ln\left(\frac{h_c}{b}\right)+1\right]$$

(b: Burgers vector, μ: Poisson's ratio, and co: a degree of lattice misfit between the direction control film and the single crystal semiconductor layer).

A first difference between a coefficient of thermal expansion of the strain compensation layer and a coefficient of thermal expansion of the single crystal semiconductor layer may be less than a second difference between a coefficient of thermal expansion of the amorphous substrate and the coefficient of thermal expansion of the single crystal semiconductor layer.

The first difference may be equal to or less than 10% of the coefficient of thermal expansion of the single crystal semiconductor layer within a temperature range of about 200° C. to about 1200° C.

The strain compensation layer may include a molybdenum (Mo) alloy.

The strain compensation layer and the single crystal semiconductor layer may be formed in a first temperature range, and the lattice matching layer may be formed in a second temperature range that is lower than the first temperature range.

The direction control film may be formed by an ion beam assisted deposition (IBAD) process.

A crystal of the direction control film may be oriented in a (111) direction.

The direction control film may include $CeO_2$ or $Sc_2O_3$.

The buffer layer may include a single layer comprising MgO or AlN.

The buffer layer may include a first buffer layer disposed on the direction control film and a second buffer layer disposed on the first buffer layer, the second buffer layer including a material different from the first buffer layer, the first buffer layer may include $CeO_2$ or $Sc_2O_3$ formed by a deposition process different from a deposition process of the direction control film, and the second buffer layer may include MgO or AlN.

The buffer layer may include a first buffer layer disposed on the direction control film and a second buffer layer disposed on the first buffer layer, the second buffer layer including a material different from the first buffer layer, the first buffer layer may include MgO or AlN, and the second buffer layer may include a same material as a material of the single crystal semiconductor layer.

A crystallinity of the single crystal semiconductor layer may be higher than a crystallinity of the second buffer layer.

The method may further include forming a mask pattern on the lattice matching layer before forming the single crystal semiconductor layer, wherein the mask pattern includes holes exposing the lattice matching layer, and wherein the single crystal semiconductor layer is disposed on the mask pattern and fills the holes.

The method may further include forming a heat dispersion layer on the amorphous substrate before forming the lattice matching layer.

The method may further include forming a planarization layer on the heat dispersion layer before forming the lattice matching layer, wherein a surface roughness of an upper surface of the planarization layer facing the lattice matching layer is less than a surface roughness of a lower surface of the planarization layer facing the heat dispersion layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
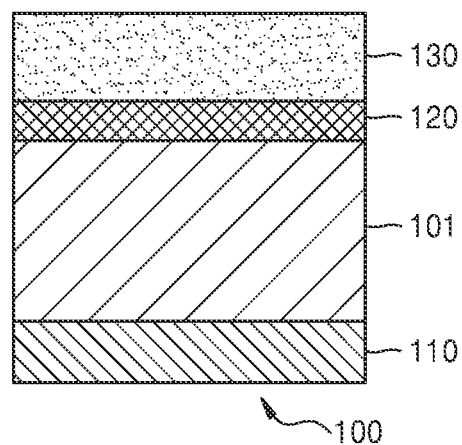
FIG. 1 is a schematic cross-sectional view of a structure of a single crystal semiconductor structure according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a single crystal semiconductor structure and a method of manufacturing the same will be described with reference to the accompanying drawings. In the drawings, like reference numerals refer to like elements, and the sizes of elements may be exaggerated for clarity of illustration. Embodiments described herein are for illustrative purposes only, and various modifications may be made therein.

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

The use of "the" and other demonstratives similar thereto may correspond to both a singular form and a plural form. Unless the order of operations of a method according to the disclosure is explicitly mentioned or described otherwise, the operations may be performed in a proper order. The disclosure is not limited to the order the operations are mentioned.

The term used for describing example embodiments such as "unit" or "module" indicates a unit for processing at least one function or operation, and may be implemented in hardware or software, or in a combination of hardware and software.

The connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language provided herein, is intended merely to better illuminate the disclosure and does not pose a limitation on the scope of the disclosure unless otherwise claimed.

FIG. 1 is a schematic cross-sectional view of a structure of a single crystal semiconductor structure 100 according to an embodiment. Referring to FIG. 1, the single crystal semiconductor structure 100 may include an amorphous substrate 101, a strain compensation layer 110 disposed on a lower surface of the amorphous substrate 101, a lattice matching layer 120 disposed on an upper surface of the amorphous substrate 101 and having a structure of two or more single crystal layers, and a single crystal semiconductor layer 130 disposed on the lattice matching layer 120.

The amorphous substrate 101 may include an amorphous material. For example, the amorphous substrate 101 may include glass, a metal layer coated with an amorphous layer, or fused silica. The amorphous substrate 101 may have a thickness of about 50 μm to about 100 μm.

Because it is difficult to directly form the single crystal semiconductor layer 130 of high quality on the amorphous substrate 101, the lattice matching layer 120 that is thin and has a single crystal structure may be first formed on the amorphous substrate 101. A lattice structure of the lattice matching layer 120 may be the same as that of the single crystal semiconductor layer 130 formed thereon. However, a lattice constant of the lattice matching layer 120 may not be the same as or similar to that of the single crystal semiconductor layer 130. As will be described later, even if a difference in the lattice constant between the lattice matching layer 120 and the single crystal semiconductor layer 130 formed thereon is large, the single crystal semiconductor layer 130 may be stably grown on the lattice matching layer 120. In addition, the single crystal quality of the lattice matching layer 120 may not be as good as a single crystal quality of the single crystal semiconductor layer 130 formed thereon.

Figure 2:
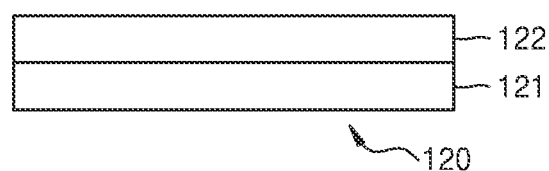
FIG. 2 is a schematic cross-sectional view of a structure according to an example of a lattice matching layer shown in FIG. 1.

The lattice matching layer 120 may have a plurality of layer structures. For example, FIG. 2 is a schematic cross-sectional view of a structure according to an example of the lattice matching layer 120 shown in FIG. 1. Referring to FIG. 2, the lattice matching layer 120 may include a direction control film 121 disposed on an upper surface of the amorphous substrate 101 and having a single crystal structure, and a buffer layer 122 disposed on the direction control film 121 and having a single crystal structure. The buffer layer 122 may include a material different from that of the direction control film 121.

For example, the direction control film 121 may be oriented in an (111) direction, a (001) direction, or a (100) direction. When the direction control film 121 is oriented in the (111) direction, the direction control film 121 may be a $CeO_2$ film or an $Sc_2O_3$ film. When the direction control film 121 is oriented in the (100) direction, the direction control film 121 may be an MgO film.

A thickness of the direction control film 121 is sufficiently small, and thus, a single crystal layer including a different material may be thermodynamically and stably provided on the direction control film 121. For example, the thickness of the direction control film 121 may be equal to or less than 10 times a critical thickness $h_c$. The critical thickness $h_c$ may be expressed by the following Equation 1.

$$h_c = \left[\frac{b}{4\pi(1+\mu)\epsilon_0}\right]\left[\ln\left(\frac{h_c}{b}\right)+1\right] \quad \text{[Equation 1]}$$

(b: Burgers vector of dislocation, μ: Poisson's ratio, co: a degree of lattice misfit between the direction control film 121 and the single crystal semiconductor layer 130)

Even if a difference of a lattice constant between two materials is large at a hetero-interface between the two materials with different lattice constants, when a thickness of either side is equal to or less than 10 times the critical thickness $h_c$ expressed by Equation 1, the elastic strain energy is not large and is thermodynamically stable. Accordingly, even if a dislocation due to misfit in the lattice constant occurs, a relatively low misfit dislocation density may be maintained. In addition, when the thickness of either side is less than or equal to the critical thickness $h_c$ expressed by Equation 1, dislocation may hardly occur.

The buffer layer 122 additionally formed on the direction control film 121 may include an AlN film or an MgO film, and, like the direction control film 121, may have a thickness equal to or less than 10 times the critical thickness $h_c$. The orientation of the buffer layer 122 may follow the orientation of the direction control film 121, and a lattice structure of the buffer layer 122 may be the same as that of the direction control film 121. The buffer layer 122 that is thin may be additionally formed on the direction control film 121, and thus the single crystal semiconductor layer 130 may be more stably formed on the lattice matching layer 120 having a plurality of thin layers of a single crystal film. In addition, the crystal quality of the single crystal semiconductor layer 130 may be further improved.

Figure 3:
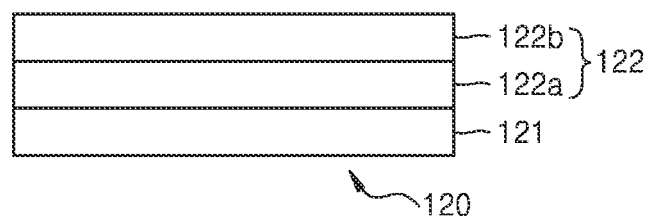
FIG. 3 is a schematic cross-sectional view of a structure according to an example of a lattice matching layer shown in FIG. 1.

The buffer layer 122 is illustrated as a single layer in FIG. 2, but is not limited thereto, and the buffer layer 122 may include a multilayer structure. FIG. 3 is a schematic cross-sectional view of a structure according to an example of the lattice matching layer 120 shown in FIG. 1. Referring to FIG. 3, the buffer layer 122 may include a first buffer layer 122a disposed on the direction control film 121, and a second buffer layer 122b disposed on the first buffer layer 122a, the second buffer layer 122b including a material different from the first buffer layer 122a. For example, the first buffer layer 122a may include a $CeO_2$ film or an $Sc_2O_3$ film formed by a deposition process different from that of the direction control film 121, and the second buffer layer 122b may include an MgO film or an AlN film.

The direction control film 121, the first buffer layer 122a, and the second buffer layer 122b may all have a thickness equal to or less than 10 times the critical thickness $h_c$. In addition, the direction control film 121, the first buffer layer 122a, and the second buffer layer 122b may all have the same lattice structure. Accordingly, the lattice matching layer 120 having three thin layers of single crystal film may be more thermodynamically stable.

Figure 4:
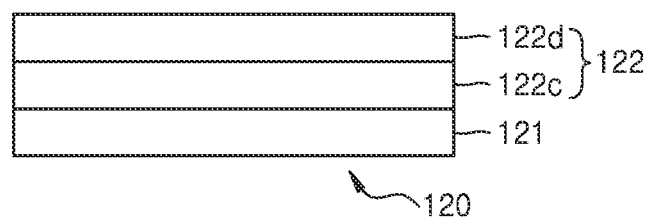
FIG. 4 is a schematic cross-sectional view of a structure according to an example of a lattice matching layer shown in FIG. 1.

FIG. 4 is a schematic cross-sectional view of a structure according to an example of the lattice matching layer 120 shown in FIG. 1. Referring to FIG. 4, the buffer layer 122 may include a third buffer layer 122c disposed on the direction control film 121 and a fourth buffer layer 122d disposed on the third buffer layer 122c, the fourth buffer layer 122d including a material different from the third buffer layer 122c. For example, the third buffer layer 122c may include an MgO film or an AlN film, and the fourth buffer layer 122d may include a single crystal semiconductor film. A single crystal semiconductor film of the fourth buffer layer 122d may include the same material as that of the single crystal semiconductor layer 130. The crystallinity of the single crystal semiconductor film of the fourth buffer layer 122d may not be higher than that of the single crystal semiconductor layer 130. In other words, the crystallinity of the single crystal semiconductor layer 130 may be higher than that of the fourth buffer layer 122d. The third buffer layer 122c and the fourth buffer layer 122d may also have a thickness equal to or less than 10 times the critical thickness $h_c$.

In FIGS. 3 and 4, the lattice matching layer 120 is illustrated as including three films, but is not limited thereto. For example, the first buffer layer 122a shown in FIG. 3 may be further disposed between the direction control film 121 and the third buffer layer 122c shown in FIG. 4.

As described above, the lattice matching layer 120 having two films or three or more films may have a thin thickness equal to or less than 0.5 μm or less as a whole. Or, a total thickness of the lattice matching layer 120 may be, for example, about 10 nanometers (nm) to about 100 nm. A thickness of each film of the lattice matching layer 120, that is, a thickness of each of the direction control film 121, the buffer layer 122, or the first to fourth buffer layers 122a, 122b, 122c, and 122d may be equal to or less than 100 nm, equal to or less than 50 nm, or equal to or less than 10 nm.

When the lattice matching layer 120 is used, it is not necessary to epitaxially grow a plurality of layers for sequentially changing a lattice constant below the single crystal semiconductor layer 130 in order to form the single crystal semiconductor layer 130. In addition, it is not necessary to form a high-quality single crystal semiconductor layer at a high temperature after forming and thermally treating a low-quality single crystal semiconductor nucleation layer at a low temperature for nucleation between heterogeneous materials.

As described above, the lattice matching layer 120 includes thin single crystal films having low elastic strain energy, thereby directly forming the single crystal semiconductor layer 130 on the lattice matching layer 120. The single crystal semiconductor layer 130 may be a single crystal III-V group compound semiconductor layer. For example, the single crystal semiconductor layer 130 may include single crystal GaN, single crystal InGaN, single crystal GaAs, single crystal AlGaAs, or single crystal AlGaInP. A thickness of the single crystal semiconductor layer 130 may be about 1 μm to about 10 μm.

Meanwhile, the strain compensation layer 110 disposed on a lower surface of the amorphous substrate 101 is included to prevent or reduce a deformation of the single crystal semiconductor structure 100 due to a difference between a coefficient of thermal expansion of the amorphous substrate 101 and a coefficient of thermal expansion of the single crystal semiconductor layer 130. Because the lattice matching layer 120 has a small thickness, most of the total thickness of the single crystal semiconductor structure 100 is occupied by the amorphous substrate 101 and the single crystal semiconductor layer 130. Therefore, when the amorphous substrate 101 and the single crystal semiconductor layer 130 have different coefficients of thermal expansion, the single crystal semiconductor structure 100 may be deformed in a process of reducing the temperature to room temperature after a high temperature process of forming the single crystal semiconductor layer 130.

The strain compensation layer 110 may include a material having a coefficient of thermal expansion similar to that of the single crystal semiconductor layer 130 in order to prevent or reduce the deformation of the single crystal semiconductor structure 100. In other words, a difference (e.g., a first difference) in the coefficient of thermal expansion between the strain compensation layer 110 and that of the single crystal semiconductor layer 130 may be less than a difference (e.g., a second difference) between the coefficient of thermal expansion between the amorphous substrate 101 and that of the single crystal semiconductor layer 130. In particular, the difference in the coefficient of thermal expansion between the strain compensation layer 110 and the single crystal semiconductor layer 130 may be equal to or less than about 10% of the coefficient of thermal expansion of the single crystal semiconductor layer 130 within a temperature range of about 200° C. to about 1200° C.

Figure 5:
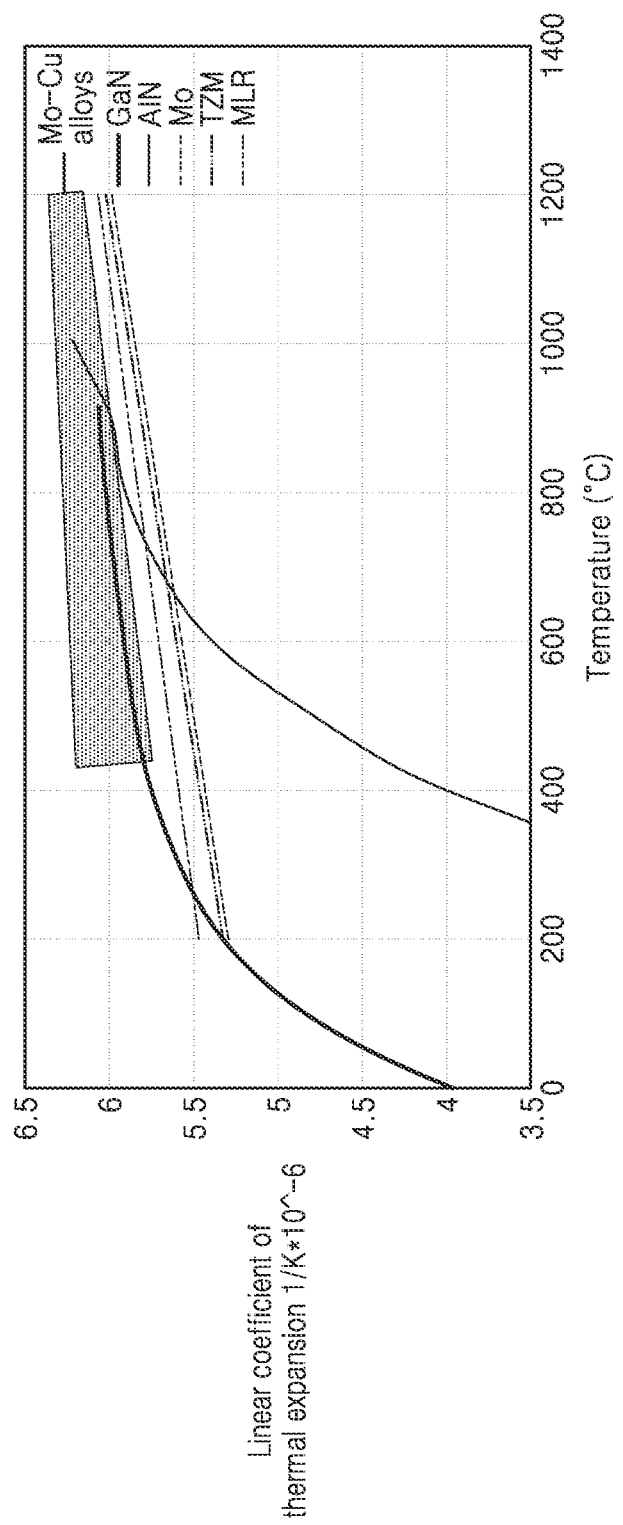
FIG. 5 is a graph showing a comparison of a coefficient of thermal expansion of a single crystal semiconductor layer and coefficients of thermal expansion of various other materials.

FIG. 5 is a graph showing a comparison of a coefficient of thermal expansion of the single crystal semiconductor layer 130 and coefficients of thermal expansion of various other materials. In the graph of FIG. 5, GaN is an example material of the single crystal semiconductor layer 130, and coefficients of thermal expansion of various materials such as AlN, a molybdenum (Mo)-copper (Cu) alloy, Mo, a Ti—Zr—Mo alloy (TZM), an Mo—LaO alloy (MLR), etc., are compared. Referring to FIG. 5, the coefficients of thermal expansion of molybdenum (Mo) metal is slightly lower than that of GaN within a temperature range of about 200° C. to about 1200° C., but the Mo metal generally has a similar coefficient of thermal expansion. In addition, alloys formed by providing molybdenum (Mo) with other metal components have higher coefficients of thermal expansion than that of molybdenum (Mo).

Thus, molybdenum (Mo) alloys may have a coefficient of thermal expansion that is very similar to that of GaN. For example, the Mo—Cu alloy may have a range of coefficients of thermal expansion that substantially matches the coefficient of thermal expansion of GaN, and adjust a coefficient of thermal expansion of the Mo—Cu alloy according to a ratio of Cu in the alloy. In addition, TZM and MLR may have a coefficient of thermal expansion that is very similar to that of GaN. In this regard, the strain compensation layer 110 may include various molybdenum (Mo) alloys.

In addition, the strain compensation layer 110 may have a thickness that is similar to that of the single crystal semiconductor layer 130 in order to compensate for the deformation of the single crystal semiconductor structure 100 by the single crystal semiconductor layer 130. In other words, a thickness of the strain compensation layer 110 may be selected to be within a range of about 1 μm to about 10 μm. For example, a difference in the thickness between the strain compensation layer 110 and the single crystal semiconductor layer 130 may be equal to or less than 10% the thickness of the single crystal semiconductor layer 130.

Hereinafter, a process of manufacturing the single crystal semiconductor structure 100 having the above-described structure is described with reference to FIGS. 6 to 8C.

Figure 6:
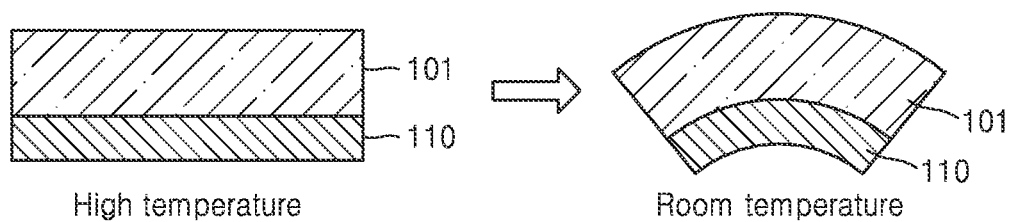
FIG. 6 shows a state of an amorphous substrate when a strain compensation layer is formed below the amorphous substrate at a high temperature and then cooled to room temperature.

First, FIG. 6 shows a state of the amorphous substrate 101 when the strain compensation layer 110 is formed below the amorphous substrate 101 at a high temperature and then reduced to room temperature. Referring to the left side of FIG. 6, the strain compensation layer 110 may be first formed on a lower surface of the amorphous substrate 101. The strain compensation layer 110 may be formed in a temperature range similar to that of a process of forming the single crystal semiconductor layer 130. For example, the strain compensation layer 110 may be formed in a temperature range of about 900° C. to about 1050° C. Further, the strain compensation layer 110 may be formed by forming a molybdenum alloy film on the lower surface of the amorphous substrate 101 through a sputtering process.

Meanwhile, after forming the strain compensation layer 110 on the lower surface of the amorphous substrate 101, when the amorphous substrate 101 is withdrawn from a chamber and cooled to room temperature, the amorphous substrate 101 may be deformed due to a difference in a coefficient of thermal expansion between the amorphous substrate 101 and the strain compensation layer 110. This is because the strain compensation layer 110 having a relatively large coefficient of thermal expansion contracts by a relatively large amount, and the amorphous substrate 101 having a relatively small coefficient of thermal expansion contracts by a relatively small amount. However, when a subsequent process is performed before the temperature of the amorphous substrate 101 is lowered to room temperature, the amorphous substrate 101 may not be significantly deformed. In addition, even after the amorphous substrate 101 is cooled to room temperature and deformed, the amorphous substrate 101 may reconstruct to its original flat state again while performing the subsequent process by increasing the temperature inside the chamber.

Figure 7:
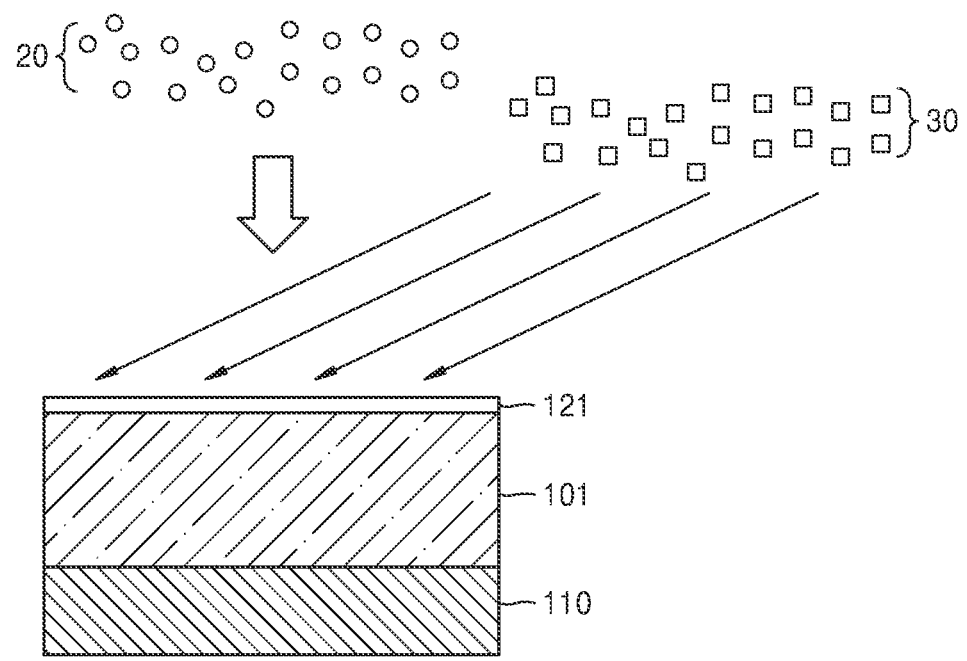
FIG. 7 is a schematic conceptual diagram of a process of forming a lattice matching layer on the amorphous substrate shown in FIG. 6.

After the strain compensation layer 110 is formed, the lattice matching layer 120 may be formed on an upper surface of the amorphous substrate 101. FIG. 7 is a schematic conceptual diagram of a process of forming the lattice matching layer 120 on the amorphous substrate 101 shown in FIG. 6. In particular, FIG. 7 is a schematic conceptual diagram of a process of forming the direction control film 121 of the lattice matching layer 120 on the amorphous substrate 101. Referring to FIG. 7, while providing materials 20 constituting the direction control film 121 together with inert elements 30 in a chamber in which the amorphous substrate 101 is disposed, the direction control film 121 may be formed using an ion beam assisted deposition (I BAD) process. The process of forming the direction control film 121 may be performed in a temperature range of about 300° C. to about 400° C.

Using the IBAD process, a single crystal material may be grown on a surface of a material other than a single crystal. Accordingly, the direction control film 121 formed on the amorphous substrate 101 by the IBAD process may be formed as a single crystal film. The direction control film 121 may be formed to be oriented in the (111) direction, the (001) direction, or the (100) direction. For example, the direction control film 121 may be a $CeO_2$ film having the (111) direction, an $Sc_2O_3$ film having the (111) direction, or an MgO film having the (100) direction. The direction control film 121 may be formed to have a thickness equal to or less than 10 times the critical thickness $h_c$ expressed by Equation 1 above.

After the direction control film 121 is formed, the buffer layer 122 having the structure shown in FIGS. 2 to 4 may be formed on the direction control film 121. Because the direction control film 121 has a single crystal characteristic, the buffer layer 122 may be formed by a general deposition process other than the IBAD process. For example, any of the buffer layer 122 shown in FIG. 2, the first buffer layer 122a and the second buffer layer 122a shown in FIG. 3, and the third buffer layer 122c and the fourth buffer layer 122d shown in FIG. 4 may be formed using a general chemical vapor deposition (CVD) or a sputtering process. As described above, each of the buffer layer 122 shown in FIG. 2, the first buffer layer 122a and the second buffer layer 122a shown in FIG. 3, and the third buffer layer 122c and the fourth buffer layer 122d shown in FIG. 4 may also be formed to have a thickness equal to or less than 10 times the critical thickness $h_c$.

Figure 8A:
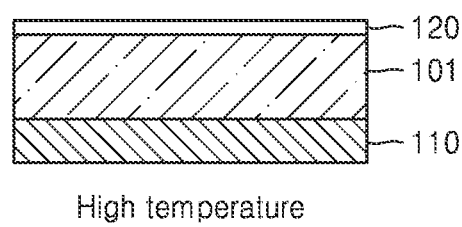
FIGS. 8A to 8C are schematic conceptual diagrams of a process of forming a single crystal semiconductor layer on the lattice matching layer disposed on the amorphous substrate shown in FIG. 7.
Figure 8B:
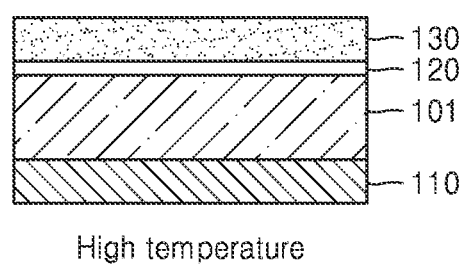
Figure 8C:
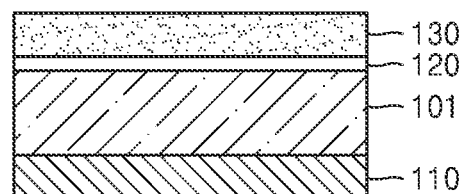

FIGS. 8A to 8C are schematic conceptual diagrams of a process of forming the single crystal semiconductor layer 130 on the lattice matching layer 120 disposed on the amorphous substrate 101 shown in FIG. 7. Referring to FIG. 8A, the amorphous substrate 101, on which the lattice matching layer 120 is formed, is disposed in a chamber and heated to a high temperature. In addition, referring to FIG. 8B, the single crystal semiconductor layer 130 may be directly grown on the lattice matching layer 120 by using an epitaxy growth process. For example, the single crystal semiconductor layer 130 may be grown by a method such as vapor phase epitaxy (VPE), metalorganic CVD (MOCVD), molecular beam epitaxy (MBE), etc. The epitaxy growth process of growing the single crystal semiconductor layer 130 may be performed in a temperature range of about 900° C. to about 1050° C.

Because the single crystal semiconductor layer 130 is grown in a temperature range similar to the temperature range in which the strain compensation layer 110 is formed, even if the amorphous substrate 101 is deformed after the strain compensation layer 110 is formed, when a process of growing the single crystal semiconductor layer 130 is performed, the amorphous substrate 101 may return to its original flat state, as shown in FIG. 8A.

In addition, referring to FIG. 8C, when the single crystal semiconductor structure 100 that is completed is cooled to room temperature, because the strain compensation layer 110 and the single crystal semiconductor layer 130 have similar coefficients of thermal expansion and have similar thicknesses, a deformation force by the strain compensation layer 110 and a deformation force by the single crystal semiconductor layer 130 may offset each other. Accordingly, the single crystal semiconductor structure 100 may maintain its original flat state without being deformed even after cooled to room temperature.

Further, because a molybdenum alloy used as the strain compensation layer 110 has an excellent thermal conductivity, the molybdenum alloy may also serve as a heat dispersion layer. For example, an Mo—Cu alloy has a thermal conductivity of about 100 W/mK to about 200 W/mK at 1000° C. This is higher than the thermal conductivity of a single molybdenum metal, and is 50 times higher than the thermal conductivity of the fused silica that may be used as the amorphous substrate 101. Therefore, while growing the single crystal semiconductor layer 130, the strain compensation layer 110 may rapidly disperse heat to maintain a uniform temperature of the amorphous substrate 101, and may help the single crystal semiconductor layer 130 to grow uniformly. In addition, after the single crystal semiconductor structure 100 is completed, deterioration of the single crystal semiconductor structure 100 may be prevented or reduced.

Meanwhile, because the lattice matching layer 120 disposed between the amorphous substrate 101 and the single crystal semiconductor layer 130 has a very thin thickness, the lattice matching layer 120 is hardly affected by deformation and restoration of the amorphous substrate 101. Further, even if a coefficient of thermal expansion of the lattice matching layer 120 is different from coefficients of thermal expansion of materials of other layers, the lattice matching layer 120 having a thin thickness hardly affects other layers.

As described above, the single crystal semiconductor layer 130 having an excellent crystal quality may be formed on the amorphous substrate 101. Accordingly, a relatively inexpensive single crystal wafer for epitaxy growth of a single crystal III-V compound semiconductor layer may be provided. In addition, the strain compensation layer 110 having a coefficient of thermal expansion similar to that of the single crystal group III-V compound semiconductor is disposed below the amorphous substrate 101, thereby preventing or reducing the deformation of the single crystal semiconductor structure 100 due to a temperature change after the process is completed.

Figure 9:
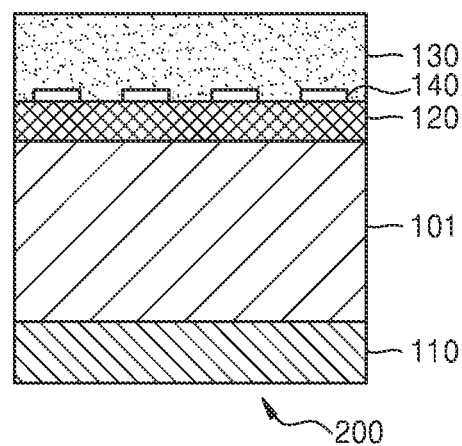
FIG. 9 is a schematic cross-sectional view of a structure of a single crystal semiconductor structure according to an embodiment.

FIG. 9 is a schematic cross-sectional view of a structure of a single crystal semiconductor structure 200 according to an embodiment. Referring to FIG. 9, the single crystal semiconductor structure 200 may include the amorphous substrate 101, the strain compensation layer 110 disposed on a lower surface of the amorphous substrate 101, the lattice matching layer 120 disposed on an upper surface of the amorphous substrate 101 and having a structure of two or more single crystal layers, the single crystal semiconductor layer 130 disposed on the lattice matching layer 120, and a mask pattern 140 disposed between the lattice matching layer 120 and the single crystal semiconductor layer 130. The amorphous substrate 101, the strain compensation layer 110, the lattice matching layer 120, and the single crystal semiconductor layer 130 are substantially the same as those described above, and thus, detailed descriptions thereof are omitted.

The mask pattern 140 may be partially provided between the lattice matching layer 120 and the single crystal semiconductor layer 130. The mask pattern 140 may partially cover the upper surface of the lattice matching layer 120. In addition, the mask pattern 140 may include a plurality of holes partially exposing the upper surface of the lattice matching layer 120. The single crystal semiconductor layer 130 may be epitaxy grown from the upper surface of the lattice matching layer 120 exposed by the plurality of holes of the mask pattern 140. In this process, the plurality of holes of the mask pattern 140 may be filled by the single crystal semiconductor layer 130. The mask pattern 140 may reduce stress of the lattice matching layer 120 and the single crystal semiconductor layer 130. Accordingly, a crystallinity of the single crystal semiconductor layer 130 may be further improved.

The mask pattern 140 may be formed by an in-situ process or an ex-situ process. When the mask pattern 140 is formed by an in-situ process, the mask pattern 140 may include silicon nitride (e.g., SiN or $Si_3N_4$). In addition, when the mask pattern 140 is formed by an ex-situ process, the mask pattern 140 may include silicon oxide (e.g., $SiO_2$) or silicon nitride (e.g., SiN or $Si_3N_4$).

Figure 10:
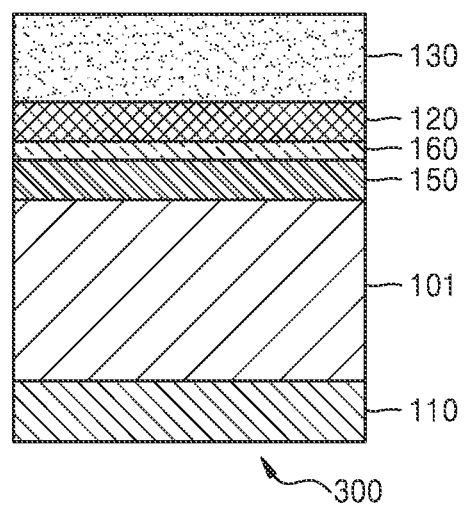
FIG. 10 is a schematic cross-sectional view of a structure of a single crystal semiconductor structure according to an embodiment.

FIG. 10 is a schematic cross-sectional view of a structure of a single crystal semiconductor structure 300 according to an embodiment. Referring to FIG. 10, the single crystal semiconductor structure 300 may include the amorphous substrate 101, the strain compensation layer 110 disposed on a lower surface of the amorphous substrate 101, the lattice matching layer 120 disposed on an upper surface of the amorphous substrate 101 and having a structure of two or more single crystal layers, the single crystal semiconductor layer 130 disposed on the lattice matching layer 120, and a heat dispersion layer 150 disposed between the lattice matching layer 120 and the amorphous substrate 101. In addition, the single crystal semiconductor structure 300 may further include a planarization layer 160 additionally disposed between the heat dispersion layer 150 and the lattice matching layer 120. The amorphous substrate 101, the strain compensation layer 110, the lattice matching layer 120, and the single crystal semiconductor layer 130 are substantially the same as those described above, and thus, detailed descriptions thereof are omitted.

The heat dispersion layer 150 may be provided on the upper surface of the amorphous substrate 101. The heat dispersion layer 150 may include a material having an excellent thermal conductivity. For example, the heat dispersion layer 150 may include a metal having an excellent thermal conductivity. For example, the heat dispersion layer 150 may include molybdenum metal. Molybdenum has a thermal conductivity of about 100 W/mK at 1000° C. The heat dispersion layer 150 may be formed by a deposition process. For example, the heat dispersion layer 150 may be formed by forming a molybdenum film on the upper surface of the amorphous substrate 101 by a sputtering process.

While growing the single crystal semiconductor layer 130, the heat dispersion layer 150 may rapidly disperse heat to maintain a relatively uniform temperature over the entire region of the amorphous substrate 101. Accordingly, the heat dispersion layer 150 may help the single crystal semiconductor layer 130 to uniformly grow. In addition, the heat dispersion layer 150 may prevent or reduce deterioration of the single crystal semiconductor structure 100 after completing the single crystal semiconductor structure 300.

A planarization layer 160 may be provided between the heat dispersion layer 150 and the lattice matching layer 120. A surface roughness of an upper surface of the planarization layer 160 may be less than a surface roughness of an upper surface of the heat dispersion layer 150 on a lower surface of the planarization layer 160. Accordingly, the planarization layer 160 may provide a flat surface for forming the lattice matching layer 120. The planarization layer 160 may include silicon oxide (e.g., SiO$_2$) or silicon nitride (e.g., SiN).

Figure 11:
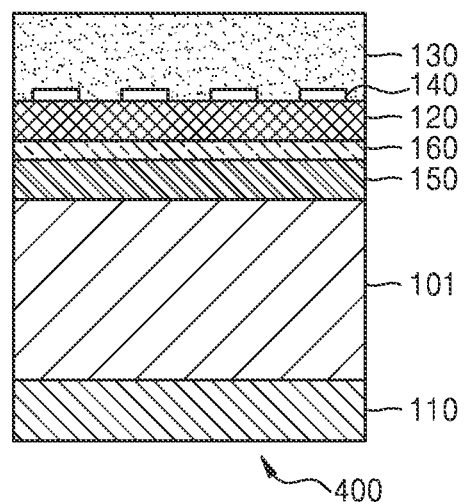
FIG. 11 is a schematic cross-sectional view of a structure of a single crystal semiconductor structure according to an embodiment.

FIG. 11 is a schematic cross-sectional view of a structure of a single crystal semiconductor structure 400 according to an embodiment. Referring to FIG. 11, the single crystal semiconductor structure 400 may include the amorphous substrate 101, the strain compensation layer 110 disposed on a lower surface of the amorphous substrate 101, the lattice matching layer 120 disposed on an upper surface of the amorphous substrate 101 and having a structure of two or more single crystal layers, the single crystal semiconductor layer 130 disposed on the lattice matching layer 120, the mask pattern 140 disposed between the lattice matching layer 120 and the single crystal semiconductor layer 130, the heat dispersion layer 150 disposed between the lattice matching layer 120 and the amorphous substrate 101, and the planarization layer 160 disposed between the heat dispersion layer 150 and the lattice matching layer 120. The configurations and operations of the amorphous substrate 101, the strain compensation layer 110, the lattice matching layer 120, the single crystal semiconductor layer 130, the mask pattern 140, the heat dispersion layer 150, and the planarization layer 160 are substantially the same as those described above, and thus, detailed descriptions thereof are omitted.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A single crystal semiconductor structure comprising:
a strain compensation layer;
an amorphous substrate disposed on the strain compensation layer;
a lattice matching layer disposed on the amorphous substrate, the lattice matching layer comprising two or more single crystal layers; and
a single crystal semiconductor layer disposed on the lattice matching layer,
wherein the lattice matching layer comprises a direction control film disposed on the amorphous substrate, the direction control film comprising a single crystal structure, and a buffer layer comprising a material different from a material of the direction control film, the buffer layer being disposed on the direction control film and comprising a single crystal structure,
wherein a thickness of the direction control film is equal to or less than 10 times a critical thickness $h_c$, and
wherein the critical thickness $h_c$ is determined by a following equation:

$$h_c = \left[\frac{b}{4\pi(1+\mu)\epsilon_0}\right]\left[\ln\left(\frac{h_c}{b}\right)+1\right]$$

(b: Burgers vector, μ: Poisson's ratio, and ε$_0$: a degree of lattice misfit between the direction control film and the single crystal semiconductor layer).

2. The single crystal semiconductor structure of claim 1, wherein, a first difference between a coefficient of thermal expansion of the strain compensation layer and a coefficient of thermal expansion of the single crystal semiconductor layer is less than a second difference between a coefficient of thermal expansion of the amorphous substrate and the coefficient of thermal expansion of the single crystal semiconductor layer.

3. The single crystal semiconductor structure of claim 2, wherein the first difference is equal to or less than 10% of the coefficient of thermal expansion of the single crystal semiconductor layer within a temperature range of about 200° C. to about 1200° C.

4. The single crystal semiconductor structure of claim 3, wherein the strain compensation layer comprises a molybdenum (Mo) alloy.

5. The single crystal semiconductor structure of claim 1, wherein a lattice structure of the direction control film matches a lattice structure of the buffer layer.

6. The single crystal semiconductor structure of claim 1, wherein a crystal of the direction control film is oriented in a (111) direction.

7. The single crystal semiconductor structure of claim 6, wherein the direction control film comprises CeO$_2$ or Sc$_2$O$_3$.

8. The single crystal semiconductor structure of claim 1, wherein the buffer layer comprises a single layer comprising MgO or AlN.

9. The single crystal semiconductor structure of claim 1, wherein the buffer layer comprises a first buffer layer disposed on the direction control film and a second buffer layer disposed on the first buffer layer, the second buffer layer comprising a material different from the first buffer layer,
wherein the first buffer layer comprises CeO$_2$ or Sc$_2$O$_3$ formed by a deposition process different from a deposition process of the direction control film, and
wherein the second buffer layer comprises MgO or AlN.

10. The single crystal semiconductor structure of claim 1, wherein the buffer layer comprises a first buffer layer disposed on the direction control film and a second buffer layer disposed on the first buffer layer, the second buffer layer comprising a material different from the first buffer layer,
wherein the first buffer layer comprises MgO or AlN, and
wherein the second buffer layer comprises a same material as a material of the single crystal semiconductor layer.

11. The single crystal semiconductor structure of claim 10, wherein a crystallinity of the single crystal semiconductor layer is higher than a crystallinity of the second buffer layer.

12. The single crystal semiconductor structure of claim 1, further comprising:
a mask pattern disposed between the single crystal semiconductor layer and the lattice matching layer,
wherein the mask pattern comprises holes exposing the lattice matching layer, and
wherein the single crystal semiconductor layer is disposed on the mask pattern and fills the holes.

13. The single crystal semiconductor structure of claim 1, further comprising a heat dispersion layer disposed between the lattice matching layer and the amorphous substrate.

14. The single crystal semiconductor structure of claim 13, further comprising a planarization layer disposed between the heat dispersion layer and the lattice matching layer,
wherein a surface roughness of an upper surface of the planarization layer facing the lattice matching layer is less than a surface roughness of a lower surface of the planarization layer facing the heat dispersion layer.

15. A method of manufacturing a single crystal semiconductor structure, the method comprising:
providing an amorphous substrate;
forming a strain compensation layer on a lower surface of the amorphous substrate;
forming a lattice matching layer on the amorphous substrate, the lattice matching layer comprising two or more single crystal layers; and
forming a single crystal semiconductor layer on the lattice matching layer,
wherein the lattice matching layer comprises a direction control film disposed on the amorphous substrate, the direction control film comprising a single crystal structure, and a buffer layer comprising a material different from the direction control film, the buffer layer being disposed on the direction control film and comprising a single crystal structure,
wherein a thickness of the direction control film is less than 10 times a critical thickness $h_c$, and
wherein the critical thickness $h_c$ is determined by a following equation:

$$h_c = \left[\frac{b}{4\pi(1+\mu)\epsilon_0}\right]\left[\ln\left(\frac{h_c}{b}\right)+1\right]$$

(b: Burgers vector, μ: Poisson's ratio, and $\epsilon_0$: a degree of lattice misfit between the direction control film and the single crystal semiconductor layer).

16. The method of claim 15, wherein, a first difference between a coefficient of thermal expansion of the strain compensation layer and a coefficient of thermal expansion of the single crystal semiconductor layer is less than a second difference between a coefficient of thermal expansion of the amorphous substrate and the coefficient of thermal expansion of the single crystal semiconductor layer.

17. The method of claim 16, wherein the first difference is equal to or less than 10% of the coefficient of thermal expansion of the single crystal semiconductor layer within a temperature range of about 200° C. to about 1200° C.

18. The method of claim 17, wherein the strain compensation layer comprises a molybdenum (Mo) alloy.

19. The method of claim 15, wherein the strain compensation layer and the single crystal semiconductor layer are formed in a first temperature range, and
wherein the lattice matching layer is formed in a second temperature range that lower than the first temperature range.

20. The method of claim 15, wherein the direction control film is formed by an ion beam assisted deposition (IBAD) process.

21. The method of claim 20, wherein a crystal of the direction control film is oriented in a (111) direction.

22. The method of claim 21, wherein the direction control film comprises $CeO_2$ or $Sc_2O_3$.

23. The method of claim 20, wherein the buffer layer comprises a single layer comprising MgO or AlN.

24. The method of claim 20, wherein the buffer layer comprises a first buffer layer disposed on the direction control film and a second buffer layer disposed on the first buffer layer, the second buffer layer comprising a material different from the first buffer layer,
wherein the first buffer layer comprises $CeO_2$ or $Sc_2O_3$ formed by a deposition process different from a deposition process of the direction control film, and
wherein the second buffer layer comprises MgO or AlN.

25. The method of claim 15, wherein the buffer layer comprises a first buffer layer disposed on the direction control film and a second buffer layer disposed on the first buffer layer, the second buffer layer comprising a material different from the first buffer layer,
wherein the first buffer layer comprises MgO or AlN, and
wherein the second buffer layer comprises a same material as a material of the single crystal semiconductor layer.

26. The method of claim 25, wherein a crystallinity of the single crystal semiconductor layer is higher than a crystallinity of the second buffer layer.

27. The method of claim 15, further comprising forming a mask pattern on the lattice matching layer before forming the single crystal semiconductor layer,
wherein the mask pattern comprises holes exposing the lattice matching layer, and
wherein the single crystal semiconductor layer is disposed on the mask pattern and fills the holes.

28. The method of claim 15, further comprising forming a heat dispersion layer on the amorphous substrate before forming the lattice matching layer.

29. The method of claim 28, further comprising forming a planarization layer on the heat dispersion layer before forming the lattice matching layer,
wherein a surface roughness of an upper surface of the planarization layer facing the lattice matching layer is less than a surface roughness of a lower surface of the planarization layer facing the heat dispersion layer.

* * * * *